US006979853B2

(12) United States Patent
Sommer et al.

(10) Patent No.: US 6,979,853 B2
(45) Date of Patent: Dec. 27, 2005

(54) DRAM MEMORY CELL AND MEMORY CELL ARRAY WITH FAST READ/WRITE ACCESS

(75) Inventors: Michael Sommer, Raubling (DE); Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 46 days.

(21) Appl. No.: 10/462,533

(22) Filed: Jun. 16, 2003

(65) Prior Publication Data

US 2004/0004891 A1 Jan. 8, 2004

(30) Foreign Application Priority Data

Jun. 14, 2002 (DE) ................................ 102 26 583

(51) Int. Cl.[7] ...................... H01L 27/108; H01L 29/76; H01L 29/94; H01L 31/119
(52) U.S. Cl. ...................... 257/302; 257/300; 257/301; 257/303
(58) Field of Search ................................ 257/300, 301, 257/302, 303, 304, 288, 296; 365/222

(56) References Cited

U.S. PATENT DOCUMENTS

| 5,561,308 | A | 10/1996 | Kamata et al. | |
|---|---|---|---|---|
| 6,373,085 | B1 | 4/2002 | Hieda | |
| 6,448,600 | B1 | 9/2002 | Schlösser et al. | |
| 6,580,110 | B2 * | 6/2003 | Schrems | 257/301 |
| 2002/0125521 | A1 * | 9/2002 | Schrems | 257/301 |
| 2002/0137278 | A1 * | 9/2002 | Temmier et al. | 438/243 |
| 2002/0175360 | A1 * | 11/2002 | Beer | 257/301 |
| 2003/0169629 | A1 * | 9/2003 | Goebel et al. | 365/200 |
| 2004/0036102 | A1 * | 2/2004 | Sell et al. | 257/301 |
| 2004/0065914 | A1 * | 4/2004 | Koike et al. | 257/301 |
| 2004/0159873 | A1 * | 8/2004 | Goldbach et al. | 257/301 |

FOREIGN PATENT DOCUMENTS

| DE | 19954867 C1 | 12/2000 |
|---|---|---|
| DE | 199 43 760 C1 | 2/2001 |
| WO | 00/75984 A1 | 12/2000 |

* cited by examiner

Primary Examiner—Nathan J. Flynn
Assistant Examiner—Victor A. Mandala, Jr.
(74) Attorney, Agent, or Firm—Laurence A. Greenberg; Werner H. Stemer; Ralph E. Locher

(57) ABSTRACT

The memory cell according to the invention has a vertical selection transistor, via whose channel region the inner electrode of the trench capacitor can be connected to a bit line. The large extent of the channel region in the bit line direction means that the trench capacitor can be rapidly charged and read. The channel region is led to the bit line through an associated word line, which completely or partially encloses the channel region. A conductive channel can be formed within the channel region depending on the potential of the word line.

14 Claims, 8 Drawing Sheets

DRAM MEMORY CELL AND MEMORY CELL ARRAY WITH FAST READ/WRITE ACCESS

BACKGROUND OF THE INVENTION

Field of the Invention

The invention relates to a memory cell and a memory cell array.

With the aid of semiconductor memory cells, information can be stored in the form of a charge and read out again. A memory cell of a DRAM semiconductor memory comprises a trench capacitor and also a selection transistor. A charge representing the information to be stored is stored in the trench capacitor. If the selection transistor of the memory cell is activated by way of the associated word line, then the stored charge is transferred to a bit line of the semiconductor memory. The voltage of the bit line can be evaluated by way of an evaluation circuit, so that the charge stored in the trench capacitor can be detected as information.

In order, in the context of structures becoming ever smaller, to be able to realize, for example, a DRAM memory cell with a small area requirement, concepts with a vertically arranged selection transistor are increasingly being investigated.

The commonly assigned U.S. Pat. No. 6,448,600 and the corresponding German patent DE 199 54 867 disclose a DRAM cell configuration and a method for fabricating the same, in which a vertical selection transistor is provided. That earlier cell configuration has a trench capacitor connected to a horizontally arranged source/drain region in the upper end region. A lower source/drain region connected to a vertical connection channel is formed with an offset with respect to the upper source/drain region. The connection channel is led upward from the lower source/drain region to the bit line. A gate region is formed parallel to the connection channel. The gate region constitutes part of a word line. The earlier cell configuration has the disadvantage that a relatively large amount of area is required for the formation of the memory cell.

SUMMARY OF THE INVENTION

It is accordingly an object of the invention to provide a DRAM memory cell for fast read/write access which overcomes the above-mentioned disadvantages of the heretofore-known devices and methods of this general type and which provides for a memory cell and a memory cell array with a further-reduced area requirement, and which makes possible fast storage and read-out of digital information.

With the foregoing and other objects in view there is provided, in accordance with the invention, a memory cell formed in and about a trench hole. The memory cell comprises:

a trench capacitor formed at a lower region of the trench hole, the trench capacitor having:
an inner capacitor electrode formed within the trench hole, an outer capacitor electrode formed outside the trench hole, and a dielectric layer between the inner capacitor electrode and the outer capacitor electrode;
a vertical selection transistor formed at the upper region of the trench hole, the selection transistor having:
a first source/drain electrode connected to the inner capacitor electrode of the trench capacitor, a second source/drain electrode connected to the horizontal bit line, and a vertically running channel region between the first source/drain electrode and the second source/drain electrode;
a horizontally running word line with gate region is formed to laterally adjoin the channel region and it is electrically insulated therefrom, the word line with gate region extending perpendicularly to the bit line;
the vertically running channel region of the selection transistor extending through the horizontally running word line with gate region to the bit line above the channel region;
the word line with gate region at least partially or completely enclosing the channel region; and
the channel region, in a plan view, being disposed transversely with respect to the word line with gate region and, as seen in the bit line direction, extending essentially along one side of the trench hole.

In other words, the memory cell according to the invention has a trench capacitor arranged in the lower region of a trench hole. The trench capacitor comprises an inner electrode and also an outer counter-electrode, a dielectric layer being arranged between the inner electrode and the outer counter-electrode. In addition, the memory cell has a vertical selection transistor, via whose channel region the inner electrode of the trench capacitor can be connected to a bit line. In the memory cell according to the invention, the channel region is led through an associated word line to the bit line, the associated word line completely or at least partially enclosing the channel region. In this case, a conductive channel can be formed within the channel region depending on the potential of the associated word line.

In the solution according to the invention, the channel region is led through the associated word line in such a way that the channel region is completely or partially enclosed by the word line. What can be achieved with the aid of this geometry is that the channel region fulfills a dual function: firstly, the channel region serves as a source/drain path of the vertical selection transistor. In contrast to conventional field-effect transistors, the source/drain region in this case is enclosed preferably from all sides by the word line acting as gate electrode. The potential of the associated word line can be used to control whether or not a conductive channel is formed in the channel region. Through activation of the word line, the channel region can be transferred into the conductive state and then connects the interior of the trench capacitor to the associated bit line. The channel region thus additionally fulfills a second function and also serves as a switchable bit line contact connection. The solution according to the invention of leading the channel region through the associated word line to the bit line constitutes the simplest possible implementation of a vertical selection transistor. The "surrounded gate transistor" obtained in the solution according to the invention has a high current yield in the channel region owing to the peripherally arranged gate electrode, thus enabling the memory cell to be written to and read from rapidly.

According to the invention, the channel region is arranged at one of the broad sides of the trench hole, the extent of the channel region in the bit line direction approximately corresponding to the extent of the broad side of the trench hole. Arranging the channel region at the broad side of the trench hole results in a geometrically compact arrangement which still remains usable even with advancing miniaturization of the structures. Moreover, a "bulging" of the channel region, which is typical of channel regions arranged at the longitudinal side of the trench cell, is avoided in the case of this embodiment. The most important advantage, however, is that a large cross-sectional area results for the channel region owing to the large extent in the bit line direction. Therefore, during writing and read-out, a relatively intense current can flow through the channel region, and, in this respect, it is also possible for a large amount of charge per unit time to be transported into the cell and out of the cell. This is referred to as a high current yield of the channel region. Therefore, the invention is advantageous in particular for those applications in which rapidity and a short access time to the stored information are important.

It is advantageous if the extent of the trench hole in the bit line direction is at least 1.5 times as large as the extent of the trench hole in the word line direction. The greater the difference between the length and the width of the trench hole given a constant basic area, the larger the periphery of the trench hole becomes. The capacitance of the trench capacitor primarily depends on the periphery, and, in this respect, relatively large trench capacitances can be realized with a small basic area in this way. Large capacitances can store digital information more reliably than small capacitances. A further advantage is that a larger etching depth can be obtained with the aid of rectangular trench holes than with square trench holes.

In this case, it is advantageous in particular if the extent of the trench hole in the bit line direction is 2 to 3.5 times as large as the minimum resolution width F of the lithography used, and if the extent of the trench hole in the word line direction approximately corresponds to the minimum resolution width F there. The extent of the trench hole in the bit line direction can be chosen freely, and, in this respect, the capacitance of the trench holes can also be buried in accordance with the respective requirements.

It is advantageous if the channel region is formed as a silicon parallelepiped which is led through the associated word line. The silicon parallelepipeds on the one hand serve as channel regions of the vertical selection transistors, and on the other hand the contact between the trench cell and the associated bit line is produced via the silicon parallelepipeds. Bit line contact connections, as were used in the solutions of the prior art in order to make contact with the source/drain regions of the selection transistor, are no longer necessary in the solution according to the invention. As a result, the entire space available in the plane of the buried word lines can be used for the word lines themselves. Moreover, the entire construction of the cell is simplified, which will be advantageous in the context of further miniaturization. Furthermore, the process yield was greatly impaired precisely by defects in the patterning of the bit line contact connections used in the prior art.

It is advantageous if a gate oxide layer is arranged between the silicon parallelepiped and the associated word line which completely or at least partially encloses the silicon parallelepiped. A "surrounded gate transistor" can be formed in this way, in which the silicon parallelepiped is surrounded from all sides by the word line acting as gate electrode. The cell can be written to and read from rapidly via the conductive channel that can be produced in this way.

In an advantageous manner, the basic area of a memory cell amounts to 3 F×2 F, that is to say 6 F$^2$, where F denotes the minimum resolution width of the lithography used. Such a small basic area allows DRAM arrays with a high memory cell density to be realized.

It is advantageous if the associated word line is made wider than the extent of the channel region in the bit line direction. This ensures, on the one hand, that the word line encloses the channel region from all sides, so that a strong conductive channel can form within the channel region given a corresponding potential of the word line. On the other hand, the word line should be made wider than the extent of the channel region in the bit line direction, in order that the word line has a high conductivity. A high conductivity of the word line means that the channel regions can be activated rapidly.

The memory cell array according to the invention comprises a multiplicity of memory cells of the type described above.

In this case, it is advantageous if the trench holes are arranged in a regular arrangement of rows and columns. Such a regular arrangement can be produced simply in terms of process engineering. Moreover, with such a regular structure, it is possible to additionally increase the capacitance of the trench holes by a step of wet-chemical afteretching (so-called "bottling"). The higher capacitance enables reliable storage of the information to be stored.

As an alternative to this, it is advantageous if the trench holes are arranged offset relative to one another as seen in the bit line direction. This also results in a structure which is readily controllable in terms of production engineering and in which the capacitance of the trench holes can be additionally increased by a step of wet-chemical afteretching (so-called "bottling").

In accordance with an advantageous embodiment of the invention, the channel regions in all the trench holes of the memory cell array are arranged at the same broad side of the trench holes. This structure leads to relatively large distances between the individual channel regions, so that parasitic currents can largely be avoided here.

As an alternative to this, it is advantageous if the channel regions, as seen in the bit line direction, are arranged alternately at the first broad side and at the second broad side of the trench holes.

It is advantageous if the bit lines are embodied as unfolded bit lines, an external potential in each case being used as reference potential for the read-out operation. In this embodiment of the invention, it is irrelevant if channel regions of adjacent bit lines are also concomitantly activated by the word line, because each bit line is read for itself.

It is advantageous if the word lines are realized as buried word lines arranged within recesses etched into the silicon substrate. Buried word lines have the advantage over word lines applied to the silicon substrate that the insulations can be patterned very simply relative to the trench holes situated underneath, relative to the adjacent word lines and also relative to the bit lines arranged above. A covering oxide layer serves to provide insulation from the trench holes, isolation trenches filled with insulating material serve to provide insulation from adjacent word lines, and a covering layer likewise serves to provide insulation from the bit lines arranged above the word lines. A further advantage is that buried word lines have a large cross section and, in this respect, also a good conductivity because the entire word line plane can be used for fabricating the word lines. The selection transistors can be activated rapidly on account of the high conductivity of such word lines.

In accordance with an advantageous embodiment of the invention, the word lines are made wider than the broad sides of the trench holes. This ensures, on the one hand, that the word line encloses the channel region from all sides, so that a strong conductive channel can form within the channel region given a corresponding potential of the word line. On the other hand, the word line should be made wider than the extent of the broad sides of the trench holes, in order that the word line has a high conductivity. A high conductivity of the word line means that the channel regions can be activated rapidly.

The memory cell array according to the invention comprises a multiplicity of memory cells of the type described above.

In this case, it is advantageous if the word lines are composed of polysilicon. The use of polysilicon constitutes the cheapest and simplest solution in particular for wider word lines, for instance when using unfolded bit lines. Only few process steps are required for fabricating the word lines.

As an alternative to this, it is advantageous if the word lines are constructed in the form of a layer structure comprising a polysilicon layer, a tungsten layer and an insulating layer. With such a layer structure, it is possible to realize word lines which have a high conductivity even with a small width. Word lines with high conductivity can be activated more rapidly and thus enable short access times during write and read operations. One advantage of the proposed layer structure, moreover, is that polysilicon is used as "gate electrode material" directly around the channel region. The transition to tungsten takes place only at a certain distance from the channel region. As a result, the properties of the selection transistor remain unchanged.

It is advantageous if adjacent word lines are insulated from one another by isolation trenches for word line separation. During the etching of the isolation trenches, the covering oxide layer introduced into the recesses may serve as an etching stop.

Furthermore, it is advantageous if the width of the isolation trenches for word line separation is smaller than the minimum resolution width F of the lithography used. The use of a so-called spacer technique allows the fabrication of isolation trenches with a width which is less than the resolution of the lithography used. In this way, the word lines can be widened at the expense of the isolation trenches without the cell having to be enlarged overall for this purpose.

In accordance with an advantageous embodiment of the invention, the memory cell array has an insulating trench structure arranged below the buried word lines, the insulating trenches preventing parasitic currents between adjacent channel regions.

The method according to the invention for fabricating memory cells proceeds from a prepatterned substrate having a multiplicity of trench holes. A trench capacitor having an inner electrode, an outer counter-electrode and also a dielectric layer arranged between the inner electrode and the outer counter-electrode is respectively arranged in the lower region of a trench hole. In a first step, recesses for the word lines are etched into the prepatterned substrate, silicon parallelepipeds being left laterally beside the trench holes. These silicon parallelepipeds subsequently serve as channel regions of vertical selection transistors. Afterward, conductive material for fabricating buried word lines is introduced into the recesses.

Other features which are considered as characteristic for the invention are set forth in the appended claims.

Although the invention is illustrated and described herein as embodied in a DRAM memory cell for fast read/write access, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
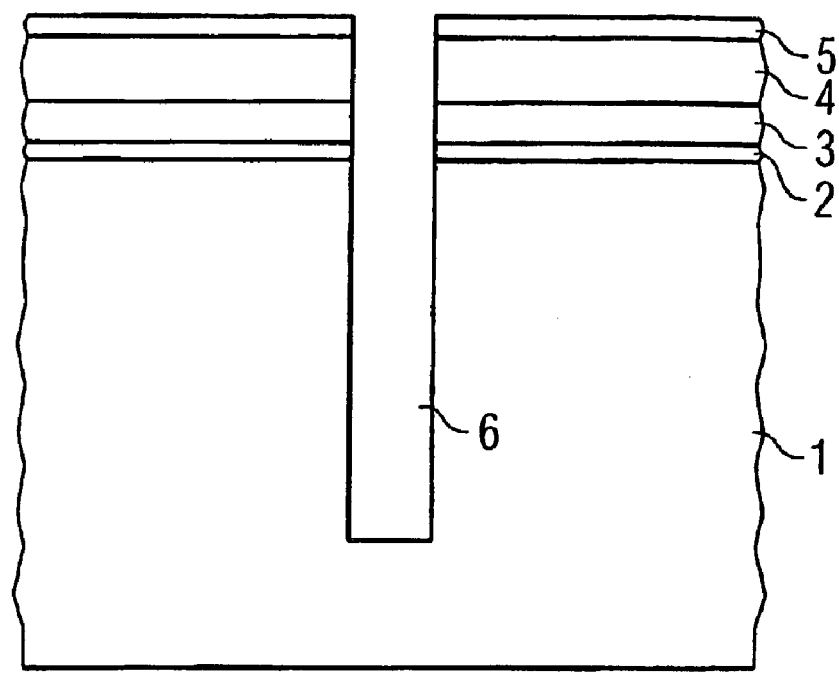
FIGS. 1–9 are partial vertical sections illustrating method stages 1 through 9 in a fabrication method according to the invention.

Referring now to the figures of the drawing in detail and first, particularly, to FIG. 1 thereof, there is shown a weakly p-doped silicon wafer that serves as a starting point for the fabrication of an array of memory cells according to the invention. In a first step, the trench holes must be etched from the silicon. For this purpose, an etching mask is applied to a silicon substrate 1. The etching mask preferably comprises a thermal oxide layer 2, a nitride layer 3 and also a further oxide layer 4, preferably made of borosilicate glass, deposited by way of chemical vapor deposition (CVD). While the thermal oxide layer 2 is only about 5 nm thick, the nitride layer 3 has a thickness of preferably 200 nm. The thickness of the oxide layer 4 is preferably approximately 1000 nm.

A photoresist layer 5 is applied to the etching mask (2,3,4), exposed by means of a lithography method and subsequently etched. In this case, areas which essentially correspond to the cross-sectional area of a trench hole are etched from the photoresist. Afterward, both the layers 2, 3, 4 and the silicon substrate 1 are etched down to a predetermined depth in order to produce trench holes 6 in this way. The resultant configuration is shown in FIG. 1.

Figure 2:
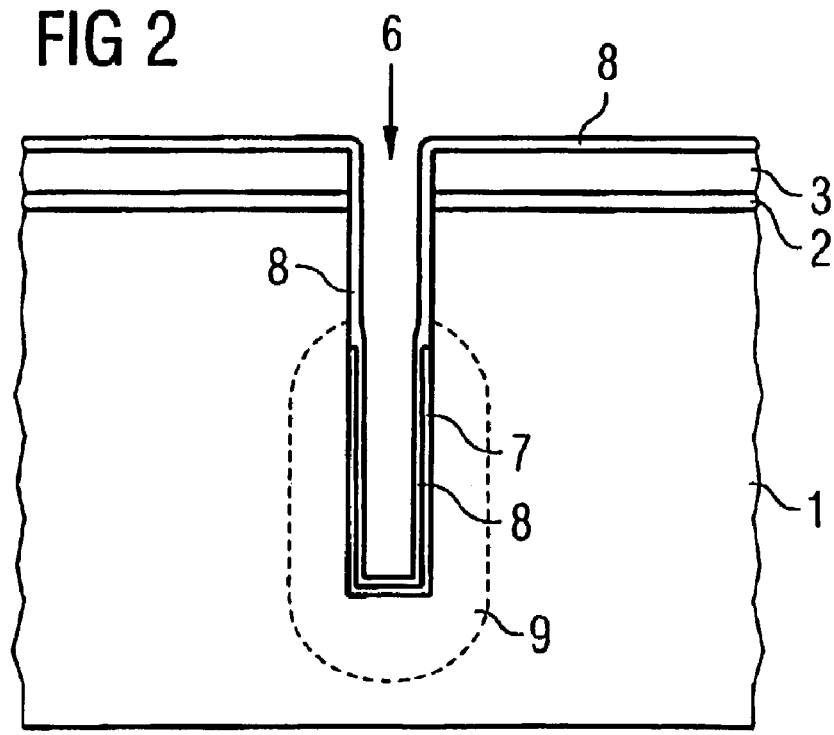

Both the photoresist layer 5 and the oxide layer 4 are then removed. The counter-electrode (buried plate) of the trench capacitor shall now be formed hereinafter. For this purpose, an arsenic-doped oxide layer 7 is deposited by means of CVD (chemical vapor deposition). Said arsenic-doped oxide layer 7 is then etched back down to a first depth in a first recess step. A further oxide layer 8 is then applied by means of CVD. In a subsequent outdiffusion process, an n-doped zone 9 is produced in the p-doped silicon substrate 1 in the vicinity of the arsenic-doped oxide layer 7 all around the lower trench region. The n-doped zone 9 is also referred to as a "buried plate" and serves as a counter-electrode of the trench capacitor. This method state is illustrated in FIG. 2.

Figure 3:
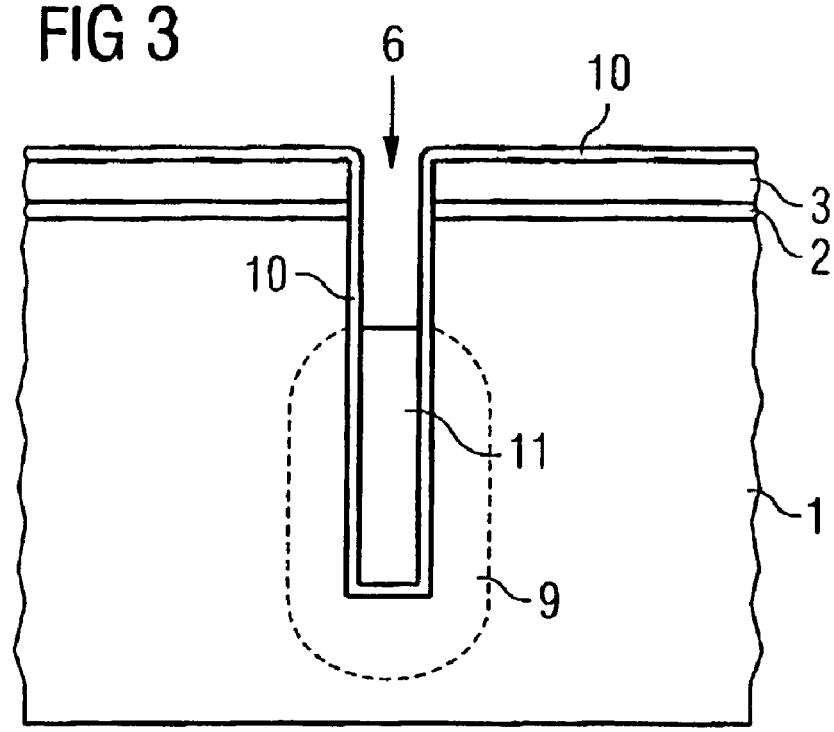

After the removal of the oxide layer 8 and the arsenic-doped oxide layer 7, a dielectric layer 10 is applied on the inside of the trench hole 6. The dielectric layer 10 is preferably a nitride oxide layer having a thickness of about 5 nm. The dielectric layer 10 subsequently serves as a dielectric of the storage capacitor. The lower region of the trench hole 6 is filled with a first polysilicon 11. For this purpose, firstly the entire trench hole 6 is filled with n-doped polysilicon, and then the polysilicon is etched back again down to the first depth. This method state is shown in FIG. 3.

The dielectric layer 10 can then be removed from the sidewalls of the trench hole 6 in the upper region of the trench hole, that is to say in the region above the first polysilicon 11. Next, a so-called collar oxide 12 is deposited on the sidewall of the trench hole by means of CVD in the region above the dielectric layer 10. The collar oxide 12 is preferably composed of silicon oxide. After the deposition, the collar oxide 12 is etched back anisotropically. The collar oxide 12, also referred to as "thick oxide", primarily serves for preventing parasitic currents between the n-doped zone 9 and the selection transistor of the memory cell, which will be described further below.

Figure 4:
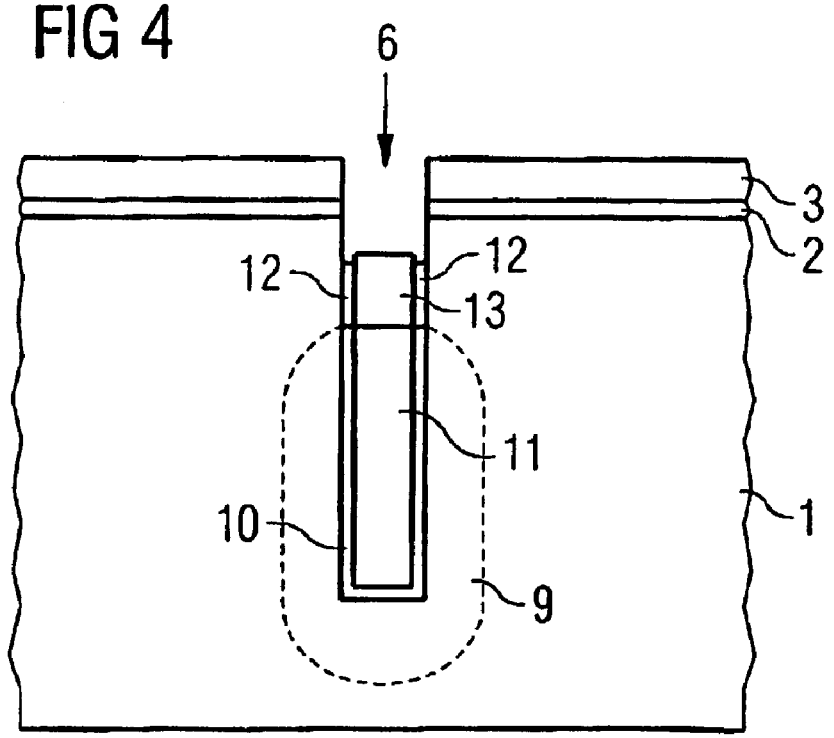

Next, a second polysilicon 13 is deposited into the trench hole 6 and subsequently etched back down to a second depth in a second recess step. Afterward, the collar oxide 12 is removed to below the upper edge of the second polysilicon 13. This method state is shown in FIG. 4.

Figure 5:
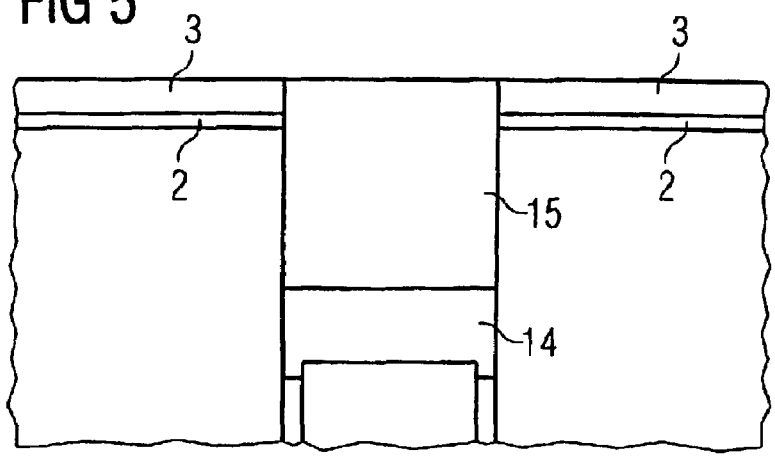

Proceeding from this method state, an n-doped third polysilicon 14 is deposited into the trench hole 6. Arsenic-doped polysilicon is preferably used in this case. In the subsequent third recess step, the third polysilicon 14 is etched back down to a third depth. The trench hole 6 is filled with a filling material 15. This method state is shown in FIG. 5.

Figure 6:
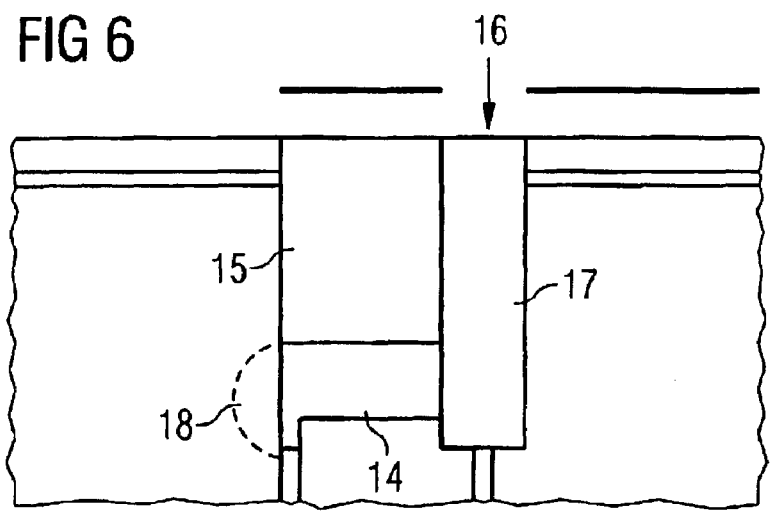

On the side opposite to the vertical selection transistor, an insulating trench 16 is etched by means of a corresponding photomask, and then filled with insulating material 17. In a thermal outdiffusion process, an n-doped buried strap region 18 is then produced by outdiffusion from the n-doped third polysilicon 14. That region subsequently serves as lower source/drain region of the vertical selection transistor. This method state is illustrated in FIG. 6. It should be understood, however, that the thermal outdiffusion process can also be performed at a later point in time.

Figure 7:
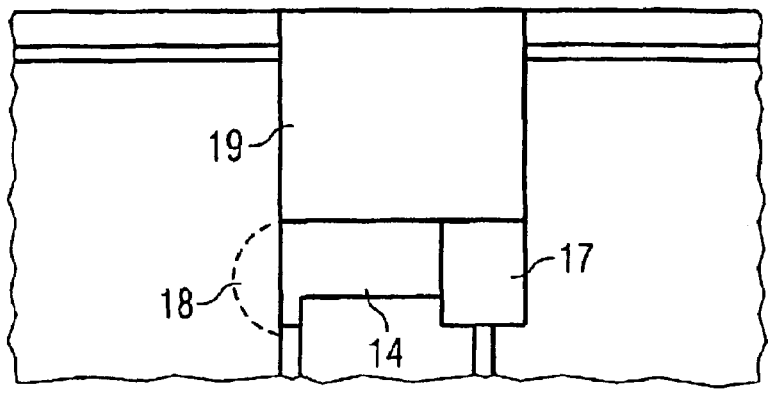

Both the filling material 15 above the third polysilicon 14 and the insulating material 17 in the insulating trench 16 are etched back down to the third depth, that is to say down to the upper edge of the third polysilicon 14, in a fourth recess step. The filling material 15 is completely removed in the process. The third polysilicon 14 may serve as an etching stop during this fourth recess step. Afterward, the etched-free upper region of the trench hole is filled with a protective material 19. This method state is illustrated in FIG. 7.

Figure 8:
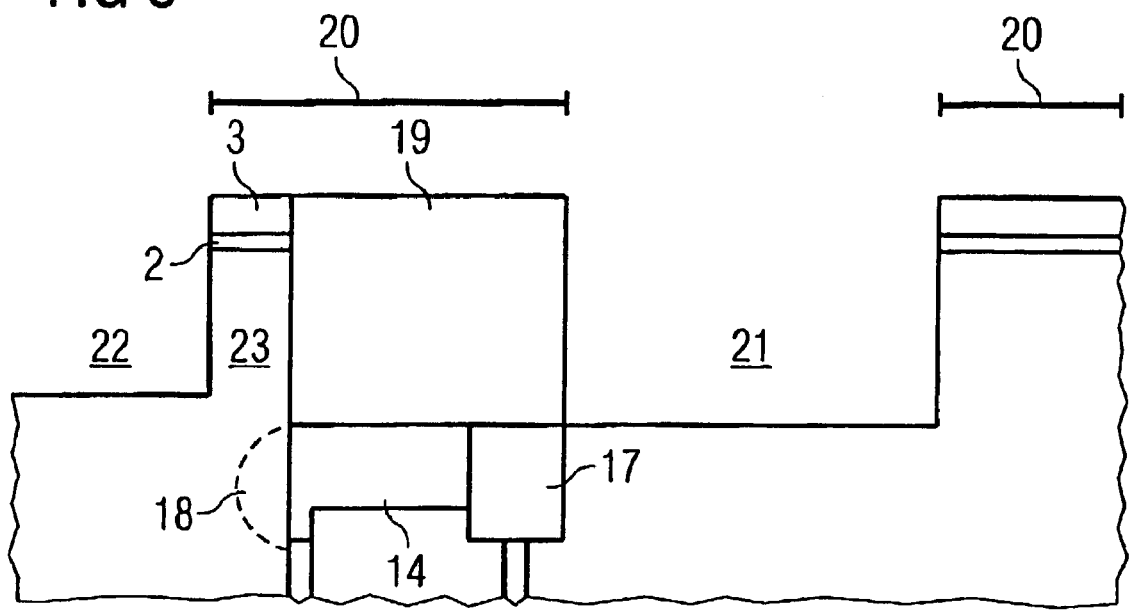

Next, recesses for accommodating the buried word lines are patterned. For this purpose, the silicon substrate is etched selectively at locations 21 and 22 with the aid of the photomask 20, the protective material 19 still remaining during this first etching step. A silicon parallelepiped 23 situated beside the trench hole is also left during this first etching step. The silicon parallelepiped 23 will subsequently serve as a channel region of the selection transistor, a conductive channel being able to form within the silicon parallelepiped 23 depending on the potential of the word line. The method state after the first etching step is illustrated in FIG. 8.

The protective material 19 is completely removed in a subsequent second etching step. The third polysilicon 14 serves as an etching stop during this second etching step.

Recesses 24 for the word lines are completely etched away after this second etching step.

Figure 9:
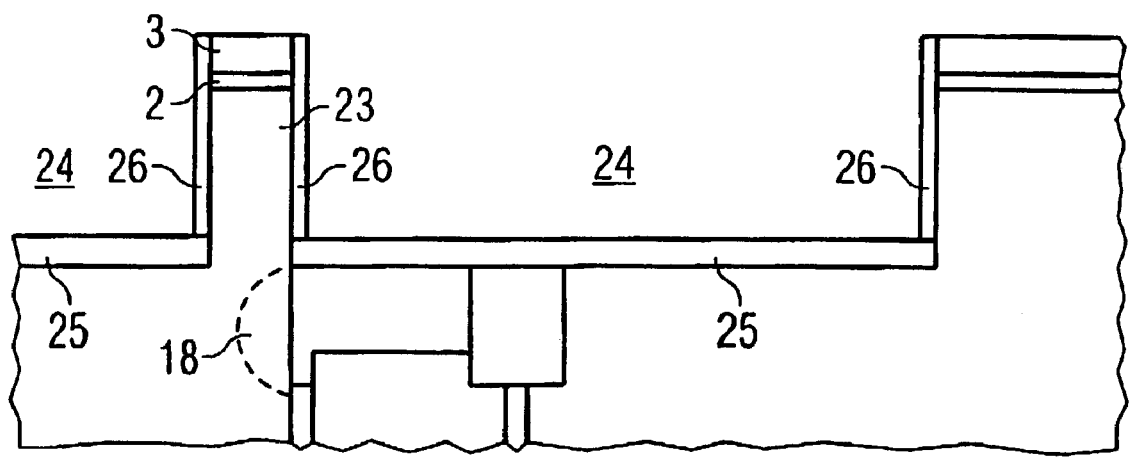

Afterward, a covering oxide layer 25 is introduced into the recesses 24, said layer having the task of insulating the trench filling from the word line situated above. In order to produce the covering oxide layer 25, the recesses 24 are first filled with an oxide or with another insulating material by means of a CVD method (chemical vapor deposition). This insulating material is subsequently etched back until only the covering oxide layer 25 having the desired thickness is present. A gate oxide 26 is applied to the sidewalls of the recesses 24 in a thermal process. The gate oxide is a thermally produced thin oxide. The corresponding method state is shown in FIG. 9.

Figure 10:
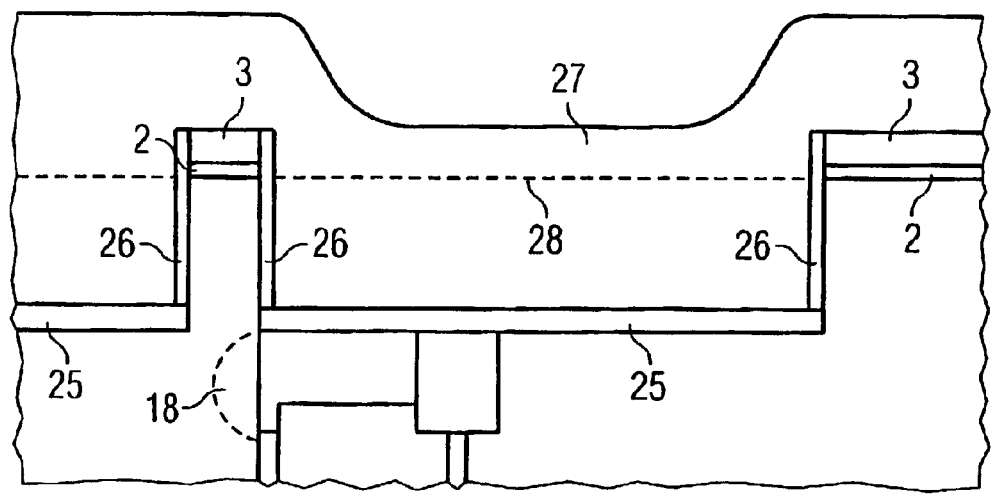
FIG. 10 is a similar view illustrating a tenth method state in accordance with a first method alternative.
Figure 11:
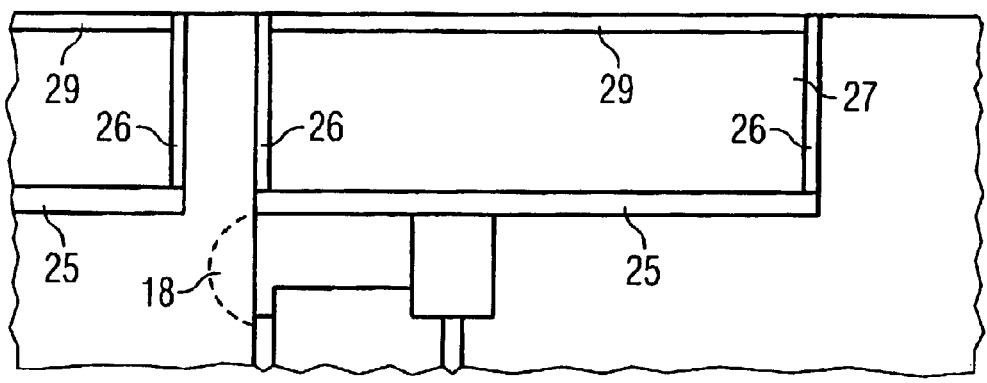
FIG. 11 shows an eleventh method state in accordance with the first method alternative.
Figure 12:
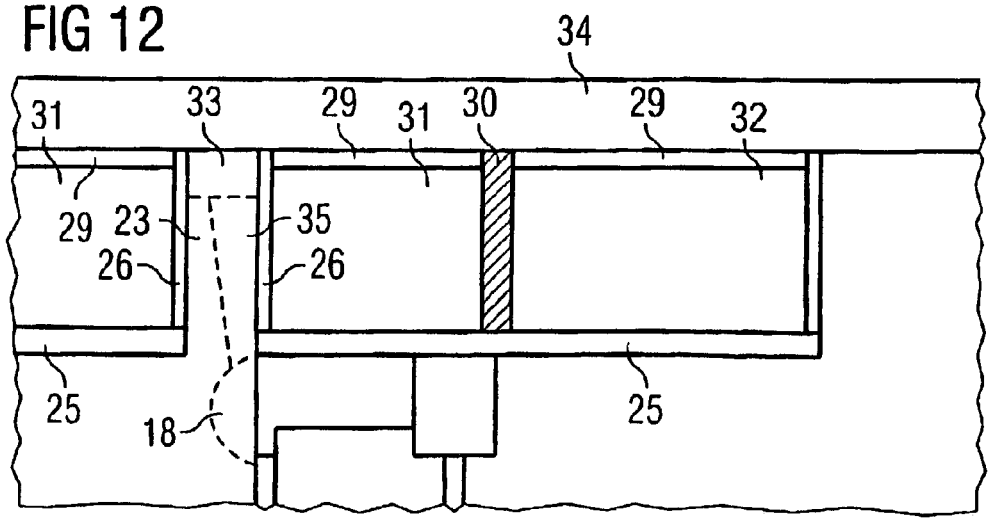
FIG. 12 shows a twelfth method state in accordance with the first method alternative.

Next, conductive material for the word lines must be introduced into the recesses 24. In this case, the silicon parallelepipeds are enclosed by the conductive material. In the first method alternative for patterning the word lines, which is illustrated in FIGS. 10 to 12, firstly n-doped polysilicon 27 is deposited on the prepatterned substrate by means of a CVD method. This method state is illustrated in FIG. 10.

Afterward, the substrate is ground plane by means of a chemical mechanical polishing method (CMP), to be precise such that the initially applied nitride layer 3 and also the thermal oxide layer 2 are concomitantly removed. The level to which the substrate is ground away is depicted as line 28 in FIG. 10.

After the process of grinding plane, the polysilicon 27 is etched back to below the substrate surface. Insulating material is subsequently deposited on the etched-back polysilicon 27 by means of CVD, to be precise preferably oxide or nitride. After the deposition of the insulating material, the substrate surface is again ground plane by means of chemical mechanical polishing (CMP) in order thus to pattern an insulating layer 29. This method state is illustrated in FIG. 11.

Next, the individual word lines arranged next to one another must be electrically insulated from one another. For this purpose, with the aid of a mask step, isolation trenches for word line separation are etched from the n-doped polysilicon 27. In this case, the covering oxide layer 25 preferably serves as an etching stop during the patterning of the isolation trenches. After etching, the isolation trenches are filled with insulating material, preferably with oxide or nitride. FIG. 12 shows how a first word line 31 is insulated from a second word line 32 by means of an isolation trench 30. In this case, the silicon parallelepiped 23 is enclosed all around by the first word line 31.

In order to be able to make better contact with the silicon parallelepiped 23 via the bit line situated above, an n-doped region 33 may be produced in an upper region of the silicon parallelepiped 23 by means of ion implantation.

As in previous methods, various metalization planes may then be applied to the substrate that has been prepatterned in this way. Bit lines which serve for the contact connection of the channel regions in the silicon parallelepipeds are patterned directly on the substrate surface. In this case, a bit line 34 runs perpendicular to the word lines 31, 32. This method state is illustrated in FIG. 12.

The trench capacitor can be contact-connected with the bit line 34 via a conductive channel 35 that can be formed within the silicon parallelepiped 23. In this case, the fact of whether a conductive channel 35 forms within the silicon parallelepiped 23 depends on the potential of the word line 31 which encloses the silicon parallelepiped 23 all around.

Polysilicon was used as conductive material in the method for patterning the word lines presented with reference to FIGS. 10 to 12. An alternative method for patterning the word lines is described with reference to FIGS. 13 and 14, in which method, instead of polysilicon, a layer structure comprising polysilicon, titanium and tungsten is introduced into the recesses 24. This makes it possible to increase the conductivity of the word lines compared with the polysilicon solution.

Figure 13:
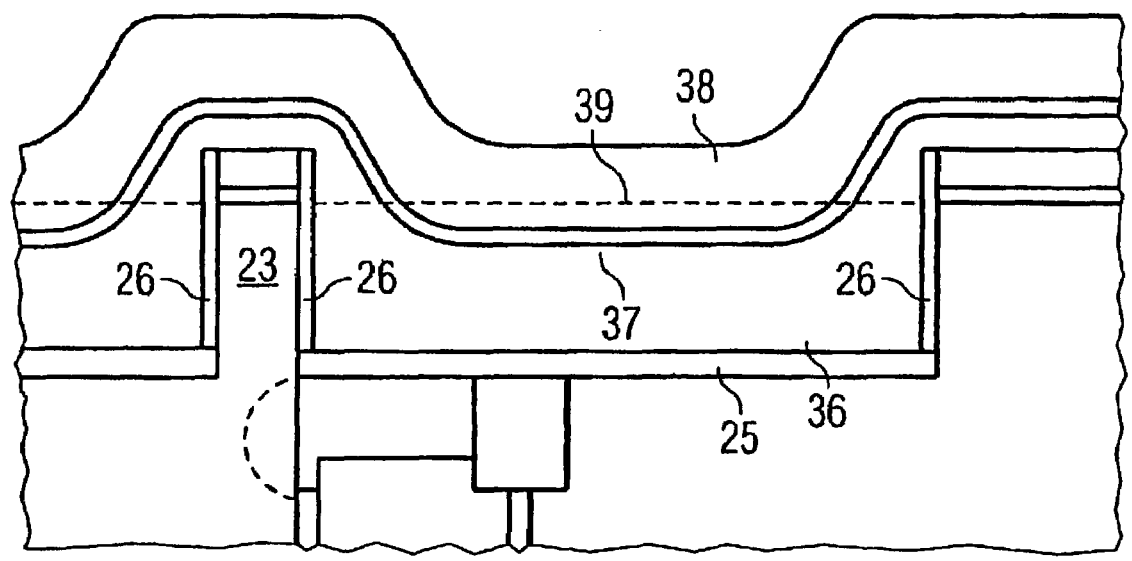
FIG. 13 shows a tenth method state in accordance with a second method alternative.

The method state shown in FIG. 9 is taken as a starting point for producing the layer structure. An n-doped polysilicon layer 36 is deposited onto the prepatterned substrate by means of a CVD method. However, the thickness of the polysilicon layer 36 is smaller than the thickness of the polysilicon layer 27 shown in FIG. 10. A thin titanium layer 37 is deposited onto the polysilicon layer 36. A tungsten layer 38 is subsequently applied to the titanium layer 37, which serves as "interface layer". The tungsten layer 38 is responsible for the low conduction resistance of the layer structure. The method state thus reached is illustrated in FIG. 13.

Next, the substrate surface is ground plane by means of chemical mechanical polishing (CMP). The nitride layer 3 applied at the beginning and the thermal oxide layer 2 are also removed during the grinding of the substrate. The level to which the substrate is ground away is depicted as broken line 39 in FIG. 13.

The insulation between the buried word lines and the bit lines situated above is then patterned. For this purpose, the layer structure introduced into the recesses 24 is firstly etched back slightly. Afterward, an insulating material such as oxide or nitride is deposited on the substrate surface by means of CVD, and then the substrate surface is once again ground plane by way of chemical mechanical polishing (CMP). An insulating layer 40 is produced in this way.

At the present method state, the recesses 24 are surrounded by a continuous conductive layer structure enclosing the silicon parallelepipeds. This contiguous conductive structure in the recesses 24 must now be divided into individual, separately drivable word lines with the aid of isolation trenches. For this purpose, in a mask step, isolation trenches for word line separation are etched from the prepatterned substrate. The covering oxide layer 25 preferably serves as an etching stop in this case. The isolation trenches thus obtained, for example an isolation trench 41, are subsequently filled with insulating material (e.g. oxide, nitride). Afterward, the substrate surface is once again planarized by means of CMP. The isolation trench 41 insulates a word line 42 from a word line 43. The silicon parallelepipeds are in each case enclosed by an associated word line. By way of example, the silicon parallelepiped 23 is enclosed all around by the word line 42.

Figure 14:
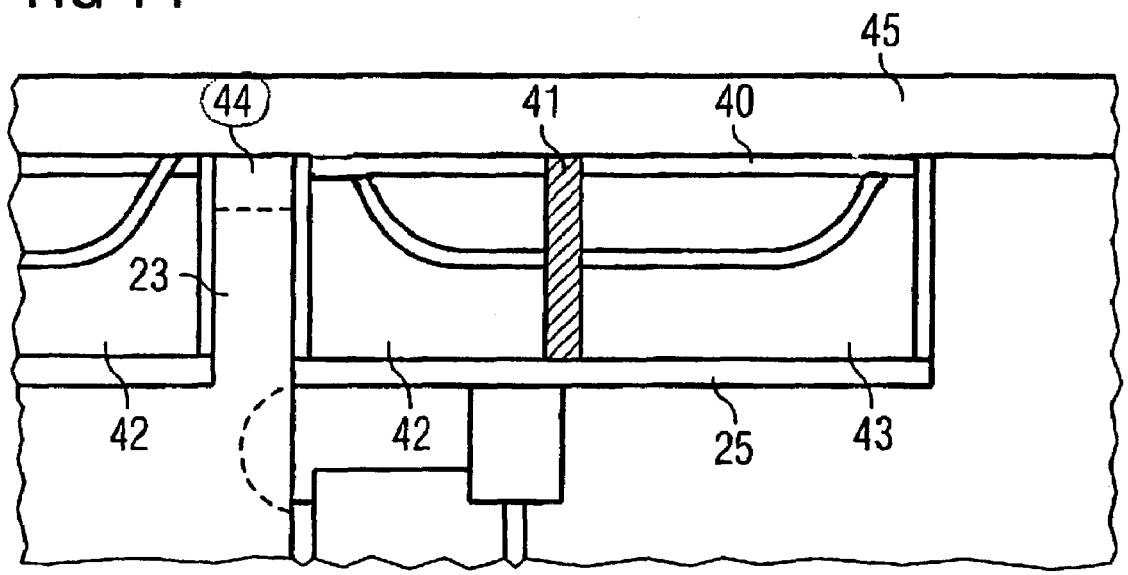
FIG. 14 shows an eleventh method state in accordance with the second method alternative.

Bit lines are subsequently applied to the silicon substrate that has been prepatterned in this way with the word lines introduced into the recesses 24. In order to be able to make better contact with the silicon parallelepipeds by means of the bit lines, the silicon parallelepipeds can be implanted with n-doping material in an upper region 44. In this case, as seen from above, the bit lines run perpendicular to the word lines. By way of example, a bit line 45, with which the silicon parallelepiped 23 is contact-connected, runs perpendicular to the word lines 42, 43. This method state is illustrated in FIG. 14.

Figure 15A:
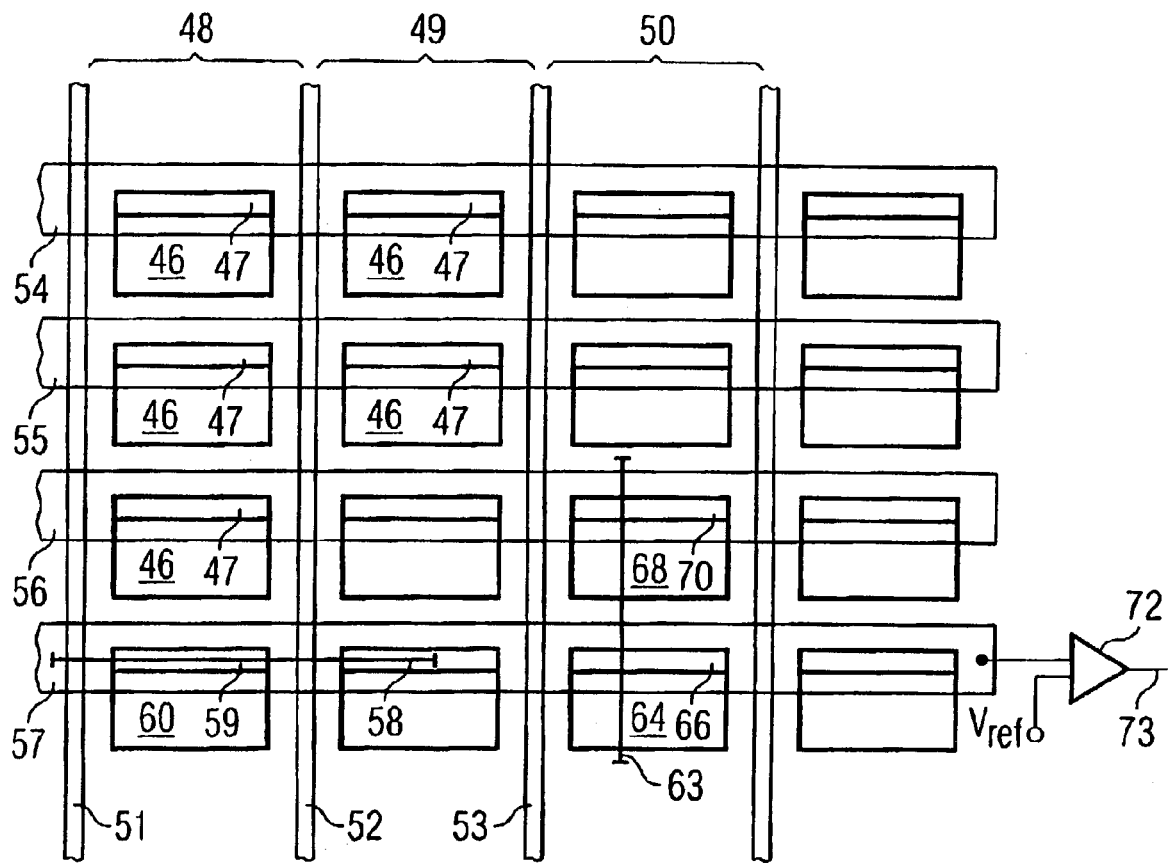
FIG. 15A is a plan view of a first layout variant of the invention, in which the channel regions are respectively arranged at the upper broad side of the trench holes.

FIG. 15A illustrates a first layout variant of a memory cell array according to the invention in plan view. Trench holes 46 are discernible, which have a rectangular trench form with a relatively large ratio of width to length. In the solution shown in FIG. 15A, the trench holes 46 have an extent of 2 F in the bit line direction, while the extent in the word line direction is approximately 1 F. However, the width of the trench holes, that is to say the extent of the trench holes in the word line direction, can also be increased to 3 F or 4 F. In this case, the quantity F denotes the minimum resolution width of the fabrication process used, that is to say of the lithographic process that is employed. In the layout variant shown in FIG. 15A, a ratio of width to length of 2:1 results for the trench holes 46. This results in a relatively large periphery of the rectangular trench holes 46. Given the same area of a rectangle, the periphery is larger, the larger the difference between width and length. Since it is principally the periphery of the trench holes that contributes to the capacitance, a large ratio of width to length results in a relatively high trench capacitance with respect to the cell area.

Compared with a square trench hole, a larger etching depth can be realized with a rectangular trench hole. Even with further miniaturization of the dimensions of the memory cell, a sufficiently high storage capacitance of the trench holes can be ensured by the trench holes being etched to a corresponding depth.

In the first layout variant shown in FIG. 15A, silicon parallelepipeds 47 are respectively arranged at a broad side of the trench hole. The silicon parallelepipeds 47 extend over the entire broad side of the respective trench hole. In FIG. 15A, the silicon parallelepipeds 47 are respectively arranged at the upper broad side in the case of all the trench holes. The silicon parallelepipeds 47 are led through word lines 48, 49, 50 to the substrate surface and to the bit lines, each silicon parallelepiped being surrounded all around by the associated word line. Arranged between a silicon parallelepiped 47 and the surrounding word line is a gate oxide layer which encloses the silicon parallelepiped and insulates it from the associated word line. A conductive channel forms within the silicon parallelepipeds 47 depending on the potential of the surrounding word line. In this respect, the enclosing word line provides the gate potential for the channel region that can be formed within the silicon parallelepipeds 47. In this respect, it is possible to talk of a vertical selection transistor with a peripherally arranged gate electrode or of a "surrounded gate transistor."

The buried word lines 48, 49, 50 are insulated from one another by isolation trenches 51, 52, 53 for word line separation. The isolation trench 51 runs between the word lines 47 and 48, while the isolation trench 52 insulates the word lines 48 and 49 from one another. The isolation trench 53 runs between the word lines 49 and 50. With the aid of so-called spacer techniques, the isolation trenches for word line separation can be fabricated so narrow that their width is smaller than the minimum resolution width F of the fabrication process used. By virtue of this narrowing of the isolation trenches, the word lines are correspondingly widened without enlarging the space requirement of the memory cell overall. This leads to a reduction of the word line resistance and thus to a faster activation of the memory cells. In this respect, a low word line resistance results in a shorter access time to the selected memory cell with regard to write or read accesses.

The silicon parallelepipeds 47 are contact-connected directly by bit lines 54, 55, 56, 57 at the substrate surface. The channel regions of the selection transistors are activated via the word lines 48, 49, 50, while information is read from the memory cell and information is written to the memory cell via one of the bit lines 54, 55, 56, 57. Since the silicon parallelepipeds 47 are contact-connected by the respective associated bit line above the word-line upper edge, space for bit line contact connections does not have to be left free between the word lines. The bit line contact connection is effected directly via the channel regions of the vertical selection transistors. In this respect, the entire area available in the word line plane can be utilized for the word lines 48, 49, 50, which therefore have a high cross-sectional area and a low bulk resistance. The conflicting requirements for wide word lines, on the one hand, and for a small space requirement of the cells, on the other hand, can be reconciled with one another in a convincing manner with the aid of "surrounded gate transistors" activated by buried word lines.

The bit line contact connections which have been required hereto in the solutions of the prior art and have run through the word lines can be obviated in the memory cell arrays according to the invention. In the solutions of the prior art, it was often not possible to fabricate the contact to the bit line satisfactorily, or an undesirable contact between the bit line contact connection and an adjacent word line arose. Therefore, the bit line contact connections were held to be a "yield detractor" of the respective fabrication process, that is to say critical with regard to the yield. Since bit line contact connections running through the word line plane are no longer required in the solution according to the invention, these problems in the fabrication process are eliminated.

In the first layout variant shown in FIG. 15A, the trench holes are arranged in a regular arrangement of rows and columns. Small inaccuracies in the mask alignment and slight process tolerances have only little significance in the case of such an arrangement of the trench cells. Since the distance between a trench hole and all the adjacent cells is essentially of the same magnitude, it is possible to increase the trench capacitance by "bottling", that is to say by wet-chemical afteretching. As a result, a sufficiently large trench capacitance, ensuring reliable data storage, can be made available even with small cell dimensions.

The silicon parallelepipeds of the cell array shown in FIG. 15A have an extent of 2 F in the bit line direction, while the extent in the word line direction is approximately 0.5 F. A cross-sectional area of approximately 1 $F^2$, that is to say a relatively large cross-sectional area, therefore results for the silicon parallelepipeds. Owing to this large cross-sectional area, the trench cells can be rapidly written to and rapidly read from via the bit lines. In this respect, the silicon parallelepipeds 47 serving as channel regions of the selection transistors have a high so-called current yield. A consequence of this is a short access time during write or read access to the memory cells. In the case of the layout shown in FIG. 15A, it is even possible to increase the cross-sectional area of the silicon parallelepipeds 47 still further by enlarging the extent both of the trench cells 46 and of the silicon parallelepipeds 47 in the bit line direction. The layout in FIG. 15A is therefore suitable in particular for intended uses for which a high speed during write or read access is important.

Figure 15B:
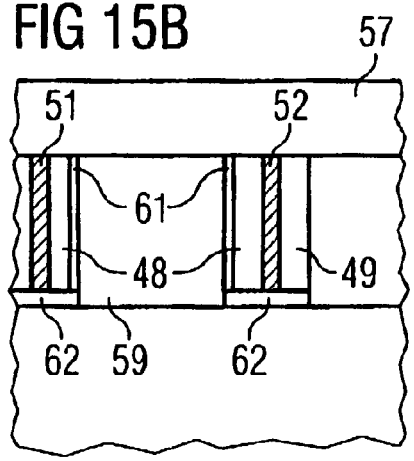
FIG. 15B is a section taken along the line 58 in FIG. 15A.

FIG. 15B shows a section through the memory cell array illustrated in FIG. 15A along a line 58. In this case, the line 58 runs in the bit line direction along the bit line 57. The sectional drawing reveals the silicon parallelepiped 59, which extends through the buried word line 48 as far as the bit line 57. The trench hole 60 can be contact-connected via the silicon parallelepiped 59. Arranged between the silicon parallelepiped 59 and the enclosing word line 48 is a gate oxide layer 61, which isolates the word line 48, serving as gate electrode, from the channel region within the silicon parallelepiped 59.

In order to be able to reliably activate the conductive channel within the silicon parallelepiped, the word line 48 must be made wider than the broad side of the silicon parallelepipeds 47 and 59, and therefore also wider than the broad side of the trench holes 46 and 60. The buried word line 48 can be discerned on the right and left beside the silicon parallelepiped 46 in FIG. 15B. The word line 48 is insulated from the adjacent word lines, for example from the word line 49, by the isolation trenches 51, 52. The covering oxide layer 62 serves for electrically insulating the word lines from the trench holes arranged underneath.

Figure 15C:
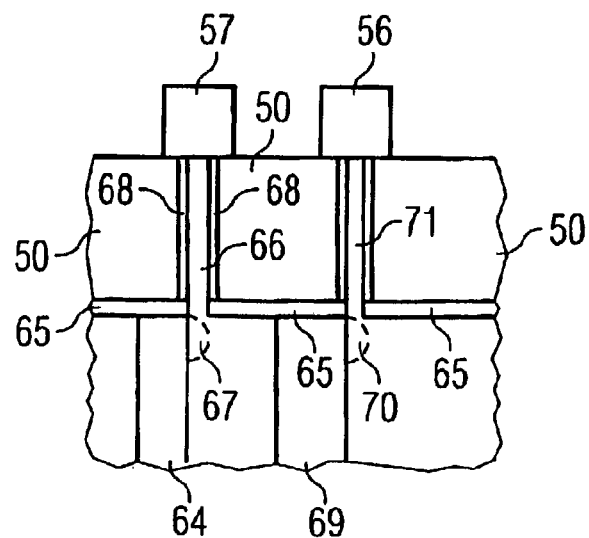
FIG. 15C is a section taken along the line 63 in FIG. 15A.

FIG. 15C illustrates a section along a line 63 running in the word line direction. A trench hole 64 can be discerned, which trench hole is situated below the word line 50 and is insulated from the word line 50 by means of a covering oxide layer 65. A silicon parallelepiped 66 is arranged in a manner adjoining the trench hole 64. A conductive channel can be formed within the silicon parallelepiped 66 depending on the potential of the enclosing word line 50. By means of the silicon parallelepiped 66, the trench hole 64 can be connected to the bit line 57 via a buried strap region 67. In this case, the silicon parallelepiped 66 is insulated from the surrounding word line 50 by a gate oxide layer 68. A trench hole 69 can be connected to the bit line 56 via a buried strap region 70 and a silicon parallelepiped 71.

In the first layout variant shown in FIGS. 15A, 15B, 15C, the read-out of the bit lines 53, 54, 55, 56 is effected in accordance with the concept of the unfolded bit line ("open bit line concept"). Each bit line is read separately, the reference potential $V_{ref}$ having to be provided in each case as an external potential. Before the actual read-out operation, the reference potential $V_{ref}$ is momentarily switched to the bit line to be read, for example to the bit line 57 shown in FIG. 15A. As a result, the bit line 57 is brought to a defined potential. The word line 50 associated with a memory cell 64 to be read is not yet activated at this point in time. The bit line 57 is subsequently isolated from $V_{ref}$ again, and the memory cell 64 is read through activation of the associated word line 50. The charge of the memory cell 64 flows onto the bit line 57, which is connected to a first input of a differential amplifier 72. The reference potential $V_{ref}$ is present at the second input of the differential amplifier 72. The differential amplifier 72 amplifies the potential difference between the potential of the bit line 57 and the reference potential $V_{ref}$ and thus generates a read-out signal 73.

One advantage of the first layout variant shown in FIGS. 15A, 15B, 15C is the regular arrangement of the trench cells in the memory cell array. Since the width of the silicon parallelepipeds corresponds to the width of the trench holes, the result is a compact unit comprising trench hole and associated channel region which can readily be implemented in terms of production engineering.

A crosstalk between the buried strap regions of different trench cells can be prevented by means of an insulating trench structure arranged below the plane of the word lines. To that end, insulating trenches, such as the insulating trench designated by the reference symbol 16 in FIG. 6, are arranged in the horizontal and/or vertical direction between the buried strap regions.

Figure 16A:
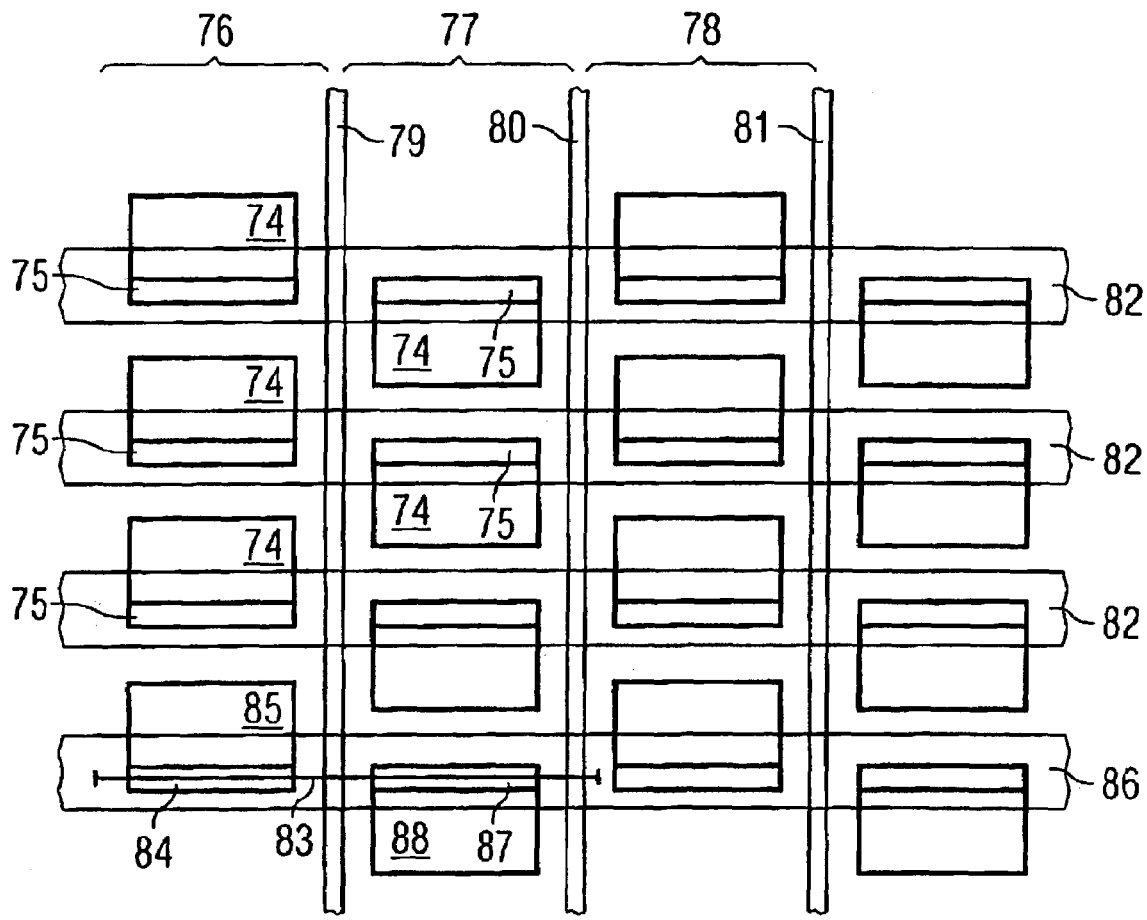
FIG. 16A is a plan view of a second layout variant, in which the channel regions are arranged alternately at the upper and lower broad sides of the trench holes.
Figure 16B:
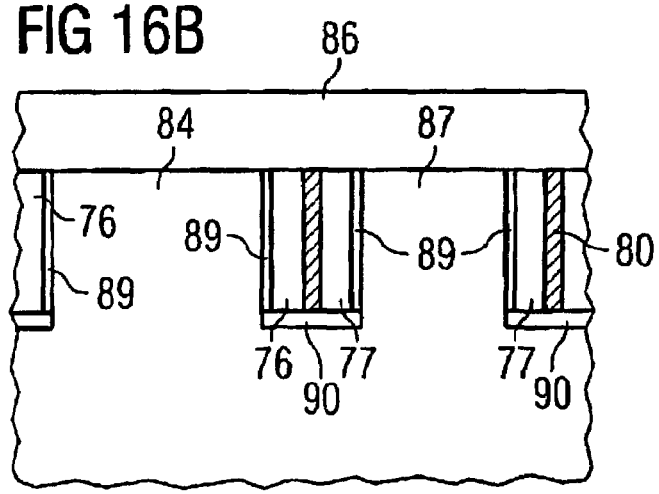
FIG. 16B is a section taken along the line 83 in FIG. 16A.

FIGS. 16A and 16B illustrate a second layout variant for a memory cell array according to the invention, in which trench holes 74 are arranged offset, as seen in the bit line direction. Silicon parallelepipeds 75 are in each case arranged alternately at the upper and lower broad sides of the trench holes 74. The silicon parallelepipeds 75 are enclosed by word lines 76, 77, 78. The word lines 76, 77, 78 are isolated from one another by isolation trenches 79, 80, 81 for word line separation. A conductive channel forms within the silicon parallelepipeds 75 depending on the potential of the respective associated word line. A conductive connection between the trench holes 74 and bit lines 82 can thus be produced via the silicon parallelepipeds 75.

FIG. 16B shows a section along the line 83 through the cell array in accordance with the second layout variant. A silicon parallelepiped 84 can be discerned, via which a trench hole 85 arranged behind can be connected to a bit line 86, and a silicon parallelepiped 87 can be discerned, via which a trench hole 88 arranged in front can be connected to the bit line 86. The silicon parallelepiped 84 can be activated by means of the word line 76. The silicon parallelepiped 87 can correspondingly be driven via the word line 77. Gate oxide layers 89 are respectively arranged between the silicon parallelepipeds 84 and 87 and the surrounding word lines. The isolation trench 79 for word line separation runs between the word line 76 and the word line 77. The word lines 76, 77 are insulated from the trench holes situated underneath by the covering oxide layer 90.

It is also the case with the second layout variant shown in FIGS. 16A, 16B that a crosstalk between the buried strap regions of different trench cells can be prevented by means of an insulating trench structure arranged below the plane of the word lines. To that end, insulating trenches, such as the insulating trench designated by the reference symbol 16 in FIG. 6, are arranged in the horizontal and/or vertical direction between the buried strap regions.

The extent of the trench hole in the bit line direction can be chosen as desired both in the first and in the second layout variant. In this respect, both the desired storage capacitance and the current yield of the channel region can be varied within wide ranges.

We claim:

1. A memory cell, comprising:
   a substrate formed with a trench hole defining a lower region and an upper region, and a horizontal bit line extending in a bit line direction, said trench hole having broad sides;
   a trench capacitor formed at said lower region of said trench hole, said trench capacitor having:
      an inner capacitor electrode formed within said trench hole;
      an outer capacitor electrode formed outside said trench hole; and
      a dielectric layer between said inner capacitor electrode and said outer capacitor electrode;
   a vertical selection transistor formed at said upper region of said trench hole, said selection transistor having:
      a first source/drain electrode connected to said inner capacitor electrode of said trench capacitor;
      a second source/drain electrode connected to said horizontal bit line; and
      a vertically running channel region between said first source/drain electrode and said second source/drain electrode;
   a horizontally running word line with gate region laterally adjoining said channel region and electrically insulated therefrom, said word line with gate region extending perpendicularly to said bit line;
   said vertically running channel region of said selection transistor extending through said horizontally running word line with gate region to said bit line above said channel region;
   said word line with gate region at least partially or completely enclosing said channel region; and
   said channel region, in a plan view, being disposed transversely with respect to said word line with gate region and, as seen in the bit line direction, extending substantially along one of said broad sides of said trench hole and approximately corresponding to an extent of said broad side of said trench hole.

2. The memory cell according to claim 1, wherein, in the plan view, a width of said word line with gate region is greater than an extent of said channel region in the bit line direction.

3. The memory cell according to claim 1, wherein said trench hole is substantially rectangular in cross section, an extent of said trench hole in a bit line direction is at least 1.5 times as large as an extent of said trench hole in the word line direction.

4. The memory cell according to claim 3, wherein the extent of said trench hole in the wed bit line direction is 2 to 3.5 times greater than a minimum resolution width F of a lithographic process used for fabricating the memory cell and the extent of said trench hole in the word line direction approximately corresponds to the minimum resolution width F.

5. A memory cell array, comprising:
   a multiplicity of memory cells according to claim 1 regularly arranged at respective crossover points of a plurality of mutually parallel word lines and a plurality of mutually parallel bit lines; and
   said Channel regions of said memory cells, as seen in the word line direction, adjoining the associated said trench holes on the same side.

6. The memory cell array according to claim 5, wherein said mutually parallel bit lines are unfolded bit lines, and an external potential is in each case applied as a reference potential for a memory cell read-out operation.

7. The memory cell array according to claim 5, wherein a basic area of a respective said memory cell amounts to 3 F×2 F, where F denotes a minimum resolution width of a lithographic process employed for fabricating said memory cells.

8. The memory cell array according to claim 5, which comprises a plurality of isolation trenches disposed to insulate mutually adjacent word lines.

9. The memory cell array according to claim 7, wherein a width of said isolation trenches is smaller than a minimum resolution width F of a lithographic process employed for fabricating said memory cells.

10. A memory cell array, comprising:
    a multiplicity of memory cells according to claim 1 regularly arranged at respective crossover points of a plurality of mutually parallel word lines and a plurality of mutually parallel bit lines; and
    said channel regions of said memory cells of adjacent bit line rows, as seen in the word line direction, adjoining the associated said trench holes on opposite end sides.

11. The memory cell array according to claim 10, wherein said mutually parallel bit lines are unfolded bit lines, and an external potential is in each case applied as a reference potential for a memory cell read-out operation.

12. The memory cell array according to claim 10, wherein a basic area of a respective said memory cell amounts to 3

F×2 F, where F denotes a minimum resolution width of a lithographic process employed for fabricating said memory cells.

13. The memory cell array according to claim 10, which comprises a plurality of isolation trenches disposed to insulate mutually adjacent word lines.

14. The memory cell array according to claim 13, wherein a width of said isolation trenches is smaller than a minimum resolution width F of a lithographic process employed for fabricating said memory cells.

* * * * *